US007248612B2

(12) United States Patent
Asatsuma et al.

(10) Patent No.: US 7,248,612 B2
(45) Date of Patent: Jul. 24, 2007

(54) SEMICONDUCTOR LASER DEVICE WITH MULTI-DIMENSIONAL-PHOTONIC-CRYSTALLIZED REGION

(75) Inventors: Tsunenori Asatsuma, Kanagawa (JP); Shoji Hirata, Kanagawa (JP)

(73) Assignee: Sony Corporation (JP)

( * ) Notice: Subject to any disclaimer, the term of this patent is extended or adjusted under 35 U.S.C. 154(b) by 231 days.

(21) Appl. No.: 10/702,604

(22) Filed: Nov. 7, 2003

(65) Prior Publication Data
US 2004/0101010 A1 May 27, 2004

(30) Foreign Application Priority Data
Nov. 22, 2002 (JP) ............................ P2002-338782

(51) Int. Cl.
*H01S 5/00* (2006.01)
(52) U.S. Cl. ............................... 372/43.01; 372/44.011
(58) Field of Classification Search ............. 372/43.01, 372/44.011, 45.01
See application file for complete search history.

(56) References Cited

U.S. PATENT DOCUMENTS 5,684,817 A * 11/1997 Houdre et al. ............ 372/45.01
6,674,778 B1 * 1/2004 Lin et al. .................. 372/46.01
2002/0037021 A1 * 3/2002 Ohkubo ........................ 372/46

FOREIGN PATENT DOCUMENTS

GB       2 354 110 A      3/2001

WO      WO 2003067724 A1 *  8/2003

OTHER PUBLICATIONS

Bewley, et al, "Nid-infared Photonic-Crystal Distributed-Feedback Lasers", Solid State Electronics, Elsevier Science Publishers, vol. 46, No. 10 Oct. 2002 pp. 1557-1566.*
"Waveguide" obtained form http://www.wikapedia.org on Jun. 20, 2006.*
Fan et al. "Design of three-dimensional photonic crystals at submicron length scales" Applied Physics Letters—Sep. 12, 1994—vol. 65, Issue 11, pp. 1466-1468.*

(Continued)

*Primary Examiner*—Dung Nguyen
(74) *Attorney, Agent, or Firm*—Rader Fishman & Grauer PLLC; Ronald P. Kananen

(57) ABSTRACT

This semiconductor laser device has the same structure as the conventional broad-area type semiconductor laser device, except that both side regions of light emission areas of active and clad layers are two-dimensional-photonic-crystallized. The two-dimensional photonic crystal formed on both side regions of the light emission area is the crystal having the property that 780 nm laser light cannot be wave-guided in a resonator direction parallel to a striped ridge within the region. The light traveling in the direction can exist only in the light emission area sandwiched between two photonic crystal regions, which results in the light laterally confined by the photonic crystal region. The optical confinement of the region suppresses the loss in the light at both edges of the stripe serving as the boundary of the optical confinement, which reduces the curve of wave surface and uniforms the light intensity distributions of NFP and FFP.

7 Claims, 5 Drawing Sheets

OTHER PUBLICATIONS

O'Brien et al. "Lasers incorporating 2D photonic bandgap mirrors" Electronics Letters, IEE Stevenage, GB, vol. 32, No. 24, Nov. 21, 1996, pp. 2243-2244.*

Painter et al. "Lasers incorporating two-dimensional photonic crystal mirrors" CLEO '97: Conference on Lasers and Electro-Optics. Baltimore,MD, May 18-23, 1997, CLEO: Conference on Lasers and Electro-Optics, New York, IEEE, US, May 18, 1997, pp. 525-525.*

EPO Search Report May 19, 2004.

Happ, et al "Short Cavity InP-lasers with 2D Photonic Crystal Mirrors" IEE Proceedings: Optoelectronics, Institution of Electrical Engineers, vol. 148, No. 4, Aug. 20, 2001, pp. 183-187.

Kalluri, et al "Large Spatial Mode, Single Frequency Semiconductor Lasers Using Two . . . ", Advanced Semiconductor Lasers and Their Applications Conference 1999, Technical Digest, 1999, pp. 16-19.

O'Brien, et al, "Lasers Incorporating 2D Photonic Bandgap Mirrors", Electronics Letters, IEE Stevenage, GB, vol. 32, No. 24, Nov. 21, 1996, pp. 2243-2244.

Painter, et al, "Lasers Incorporating Two-Dimensional Photonic Crystal Mirrors", CLEO 97, Conference on Lasers and Electro-Optics, May 18-23, 1997, IEEE,, p. 525.

Vurgaftman, et al: Photonic-Crystal Distributed-Feedback Lasers, Applied Physics Letters, American Institute of Physics, New York, Vo. 78, No. 11, Mar. 12, 2001, pp. 1475-1477.

Bewley, et al, "Mid-infrared Photonic-Crystal Distributed-Feedback Lasers", Solid State Electronics, Elsevier Science Publishers, vol. 46, No. 10 Oct. 2002, pp. 1557-1566.

"Basic and Application of Understandable Semiconductor Laser Device"; p. 180-182 with a fornt page and backside page of the book.

"O and E" p. 1524-1532, a magazine published in Dec. 1999.

* cited by examiner

SEMICONDUCTOR LASER DEVICE WITH MULTI-DIMENSIONAL-PHOTONIC-CRYSTALLIZED REGION

CROSS REFERENCE TO RELATED APPLICATIONS

The present document is based on Japanese Priority Document JP2002-338782, filed in the Japanese Patent Office on Nov. 22, 2002, the entire contents of which being incorporated herein by reference.

BACKGROUND OF THE INVENTION

1. Field of the Invention

The present invention relates to a semiconductor laser device and a method of manufacturing the same, and relates more particularly to a broad-area type semiconductor laser device in which light intensity distributions of a near field pattern (hereafter, referred to as NFP) and a far field pattern (hereafter, referred to as FFP) are uniform, and to a method of manufacturing such a semiconductor laser device.

2. Description of Related Art

The broad-area type semiconductor laser device in which a stripe width is larger than 10 μm is frequently used for a light source of a laser printer or a display apparatus, as a high output type semiconductor laser device.

Here, the configuration of a conventional AlGaAs-based broad-area type semiconductor laser device is described with reference to FIG. 5. FIG. 5 is a sectional view showing the configuration of the AlGaAs-based broad-area type semiconductor laser device. A conventional AlGaAs-based broad-area type semiconductor laser device 10 (hereafter, referred to as a conventional semiconductor laser device 10) is the semiconductor laser device for oscillating a laser light whose wavelength is 780 nm. As shown in FIG. 5, this has the multilayer structure composed of an n-$Al_{0.7}Ga_{0.3}As$ clad layer 14, an n-$Al_{0.3}Ga_{0.7}As$ guide layer 16, an $Al_{0.1}Ga_{0.9}As$ active layer 18, a p-$Al_{0.3}Ga_{0.7}As$ guide layer 20, a p-$Al_{0.7}Ga_{0.3}As$ clad layer 22 and a p-GaAs cap layer 24, which are grown sequentially on an $n^+$-GaAs substrate 12.

In the multilayer structure, the upper layers of the p-GaAs cap layer 24 and the p-AlGaAs clad layer 22 are processed as striped ridges, and n-GaAs current block layers 26 are embedded on both sides of the ridges. A p-side electrode 28 is formed on the p-GaAs cap layer 24 and the n-GaAs current block layer 26, and an n-side electrode 30 is formed on the rear surface of the $n^+$-GaAs substrate 12.

When the above-mentioned conventional semiconductor laser device is manufactured, the n-$Al_{0.7}Ga_{0.3}As$ clad layer 14, the n-$Al_{0.3}Ga_{0.7}As$ guide layer 16, the $Al_{0.1}Ga_{0.9}As$ active layer 18, the p-$Al_{0.3}Ga_{0.7}As$ guide layer 20, the p-$Al_{0.7}Ga_{0.3}As$ clad layer 22 and the p-GaAs cap layer 24 are epitaxially grown sequentially on the $n^+$-GaAs substrate 12 by using a metal organic chemical vapor deposition method (MOCVD method) and the like. Consequently, the multilayer structure is formed. Next, in the multilayer structure, the upper layers of the p-GaAs cap layer 24 and the p-AlGaAs clad layer 22 are etched to thereby form the striped ridges. Subsequently, the n-GaAs current block layers 26 are embedded and grown on both sides of the ridges, and the ridges are embedded. Next, the p-side electrode 28 is formed on the p-GaAs cap layer 24 and the n-GaAs current block layer 26, and the rear surface of the $n^+$-GaAs substrate 12 is polished to thereby adjust the thickness of the substrate. After that, the n-side electrode 30 is formed on the rear surface (for example, refer to a non-patent document 1).

The lateral mode of the laser light emitted from the semiconductor laser device has a large influence on the suitability of the device property of the semiconductor laser device when the semiconductor laser device is applied as the light source. In short, the lateral mode control to stably control the light mode in the lateral direction of the laser light emitted from the semiconductor laser device to a basic (0-th) mode is one of the important points for the control of the semiconductor laser device. In particular, the broad-area type semiconductor laser device as mentioned above has the wide stripe width. Thus, the lateral mode is apt to be a multi mode. Hence, it is difficult that the light intensity distributions of the NFP and the FFP become uniform. If the semiconductor laser device, in which the light intensity distributions of the NFP and the FFP are not uniform, is used as the light sources for printing and the like, the irregularity in the light intensity is brought about to thereby bring about the irregularity in printed characters. Also, if this is applied to a display, the image quality of a displayed image is deteriorated.

[Non-Patent Document 1]

"Basics and Application of Understandable Semiconductor Laser Device" Written by Shoji Hirata, Edited by Ohm-sha Ltd. in 2001, pages 180 to 182.

SUMMARY OF THE INVENTION

Accordingly, there has been a need to provide a semiconductor laser device in which the light intensity distributions of NFP and FFP are uniform, and a method of manufacturing the same.

By the way, the irregularities in the intensities of the NFP and the FFP are thought to be caused by the fact that a wave-guide surface is curved, in addition to the fact that the lateral mode is a multi-mode vibration. That is, the fact that the curve of the wave-guide surface causes the light intensity to tend to be concentrated on edges of both sides of the stripe is thought to be one factor of the occurrence of the irregularities in the intensities of the NFP and the FFP. One of the causes of the curved wave-guide surface results from the delay in the travel of the wave-guidance because the loss of the light occurs at the edges of both sides of the stripe.

So, the present inventors thought up the idea of suppressing the loss of the light at both side edges of the stripe and suppressing the curve of the wave-guide surface and thereby uniforming the light intensity distributions of the NFP and the FFP on the wave-guide surface in the semiconductor laser device. Moreover, in the course of continuing with the research to solve the above-mentioned problems, the present inventors thought up the idea of multi-dimensional-photonic-crystallizing, for example, two-dimensional-photonic-crystallizing the regions on both sides of the light emission area or on the light emission area. This is because the two-dimensional photonic crystallization enables the formation of the structure in which the light having a particular wavelength traveling in a particular direction cannot exist, and enables the control of the wave-guide situation to the particular direction of the light having the particular wavelength. The multi-dimensional-photonic-crystal, for example, the two-dimensional photonic crystal, depending on the structure design, disables the existence of the light having the particular wavelength traveling in the particular direction, or enables the promotion of the wave-guidance in the particular direction of the light having the particular wavelength, whereby the wave-guide situation can be controlled.

Then, the present inventors discovered the fact that by introducing the two- or multi-dimensional photonic crystal region into any of the active layer, the guide layer and the clad layer in the semiconductor laser device, and then defining the light emission area on the basis of the photonic crystal region, and thereby controlling the traveling manner of the light wave-guided through the light emission area on the basis of the photonic crystal region, it is possible to uniform the light intensity distributions of the NFP and the FFP in the semiconductor laser device, and thereby possible to control the lateral mode.

The photonic crystal implies "artificial multi-dimensional periodic structure having periodic property of level similar to wavelength of light", for example, as introduced on a page 1524 of "0 plus E" magazine in December 1999. It should be noted that "this does not indicate so-called optical crystal material". The above-mentioned periodicity implies the periodicity with regard to the distribution of refractive indexes, in many cases. An example of the photonic crystal is also reported in the same magazine. The photonic crystals in which the periodicities of the refractive index distributions are a two-dimensional direction and a third-dimensional direction are referred to as a two-dimensional photonic crystal and a third-dimensional photonic crystal, respectively.

In other words, the photonic crystal is the structure in which units have different refractive indexes, each of the units has a size similar to a wavelength of a light, and the units are arrayed such that refractive indexes are periodically changed in one-dimension or multi-dimensional area. This is expected as the material that enables an optical device having an excellent optical property, which cannot be obtained from conventional optical materials, to be attained by designing the material and the structure depending on a purpose. For example, an optical wave-guide device, a polarization splitter, a double refraction device for a visible region, and the like, in which the photonic crystal is used, are proposed.

In order to attain the above-mentioned purposes, from the above-mentioned viewpoints, the semiconductor laser device according to the present invention (hereafter, referred to as a first invention) is a semiconductor laser device having a multilayer structure including at least an active layer, a guide layer and a clad layer, wherein regions on both sides of a light emission area in one of the active layer, the guide layer and the clad layer are multi-dimensional-photonic-crystallized.

Preferably, the multi-dimensional-photonic-crystallized regions on both sides of the light emission area are in the active layer and in the guide layer formed on the active layer, and further, the multi-dimensional-photonic-crystallized regions on both sides of the light emission area are multi-dimensional-photonic-crystallized to a structure in which a laser light is not wave-guided in a resonator length direction. The multi-dimensional photonic crystallization is carried out thereby to generate the particular region where the light wave-guided in a resonator length direction cannot exist. Then, the particular region is used to carry out an optical confinement. Thus, the loss of the light is suppressed at both edges of the stripe serving as a boundary of the confinement, namely, the boundary between the light emission area and the particular region. The curve of a wave-guide surface is reduced, and the light intensity distributions of the NFP and the FFP are made uniform.

Another semiconductor laser device according to the present invention (hereafter, referred to as a second invention) is a semiconductor laser device having a multilayer structure including at least an active layer, a guide layer and a clad layer, wherein a region on a light emission area of the guide layer formed on the active layer or a region below a light emission area of the guide layer formed under the active layer is multi-dimensional-photonic-crystallized. Moreover, regions below both light emission areas of the guide layer formed under the active layer and a compound semiconductor layer formed under the guide layer are multi-dimensional-photonic-crystallized.

In the second invention, preferably, the multi-dimensional-photonic-crystallized region is formed in such a way that the wave-guidance in the resonator length direction of the laser light is promoted. The multi-dimensional-photonic-crystallized region has the crystal structure having the property to promote the wave-guidance of the laser light in the resonator length direction. Thus, the laser light traveling in the resonator direction is affected by the photonic crystallization region and stably wave-guided in the resonator length direction.

In the multi-dimensional-photonic-crystallized region of the concrete embodiments in the first and second inventions, micro pores extended in a direction vertical to a pn junction plane of the compound semiconductor layer constituting the multilayer structure are arranged at a periodic array. The present invention can be applied without any restriction on the composition of the compound semiconductor layer of the multilayer structure constituting the semiconductor laser device and the kind of the substrate. For example, it can be applied to the semiconductor laser device of an AlGaAs-based, a GaN-based, an InP-based and the like. In particular, it can be preferably applied to the broad-area type semiconductor laser device in which the width of the light emission area extended in the stripe shaped on the surface parallel to the pn junction plane of the compound semiconductor layer constituting the multilayer structure is 10 μm or more. Also, it can be preferably applied to a so-called edge-emitting semiconductor laser device in which a light output direction is not vertical to the pn junction plane.

A method of manufacturing a semiconductor laser device according to the present invention (hereafter, referred to as a first invention method) is a method of manufacturing a semiconductor laser device having a multilayer structure including at least an active layer, a guide layer and a clad layer; including the steps of: growing a predetermined compound semiconductor layer, and forming the multilayer structure having the guide layer on the active layer; forming micro pores extended in a multilayer direction of the multilayer structure so as to form a periodic array, on both side regions of a light emission area of the guide layer, and carrying out a multi-dimensional-photonic-crystallization; growing the clad layer on the guide layer that includes the multi-dimensional-photonic-crystallized region, and further forming a predetermined compound semiconductor layer thereon, to form the multilayer structure.

Another method of manufacturing a semiconductor laser device according to the present invention (hereafter, referred to as a second invention method) is a method of manufacturing a semiconductor laser device having a multilayer structure including at least an active layer, a guide layer and a clad layer; including the steps of: growing a predetermined compound semiconductor layer, and forming the multilayer structure having the guide layer on the active layer; forming micro pores extended in a multilayer direction of the multilayer structure so as to form a periodic array, on a region of a light emission area of the guide layer, and carrying out a multi-dimensional-photonic-crystallization; and growing the clad layer on the guide layer that includes the multi-dimensional-photonic-crystallized region, and further forming a predetermined compound semiconductor layer, to form the multilayer structure.

At the step of forming the micro pores extended in the multilayer direction of the multilayer structure so as to form the periodic array and then carrying out the multi-dimensional-photonic-crystallization, the typical photo lithography technique and etching processing technique are used to form the micro pores at the periodic array.

As mentioned above, according to the first invention, the regions on both sides of the light emission area in any layer of the active layer, the guide layer and the clad layer are multi-dimensional-photonic-crystallized, for example, two-dimensional-photonic-crystallized to thereby generate the particular region, in which the light wave-guided in the resonator length direction can not exist, on both sides of the light emission area. Then, the particular region is used to carry out the optical confinement. Consequently, the loss of the light at both edges of the stripe serving as the boundary of the optical confinement, namely, the boundary between the light emission area and the particular region is suppressed, which reduces the curve of the wave-guide surface and uniforms the light intensity distributions of the NFP and the FFP.

According to the second invention, the region on the light emission area or below the light emission area of the guide layer, and the guide layer formed below the light emission area and the compound semiconductor layer formed under the guide layer are multi-dimensional-photonic-crystallized, for example, two-dimensional-photonic-crystallized, which thereby enables the multi-dimensional-photonic-crystallized region to have the crystal structure having the property to promote the wave-guidance of the laser light in the resonator length direction. Moreover, the laser light traveling in the resonator length direction is affected by the photonic crystallization region and stably wave-guided in the resonator length direction. Hence, the semiconductor laser device can be attained in which the light intensity distributions of the NFP and the FFP are uniform.

The first and second invention methods are suitable for the broad-area type semiconductor laser device in which the stripe width of the light emission area is 10 μm or more.

Each of the first and second invention methods attains the manufacturing method suitable for the semiconductor laser device according to the first and second inventions.

DESCRIPTION OF THE PREFERRED EMBODIMENTS

Embodiments of the present invention will be described below in concrete and in detail by exemplifying embodiments and referring to the attached drawings. By the way, a film forming method, a composition and a film thickness of a compound semiconductor layer, a ridge width, a processing condition and the like, which are described in the following embodiments, are one exemplification to easily understand the present invention. Thus, the present invention is not limited to this exemplification.

First Embodiment of Semiconductor Laser Device

Figure 1:
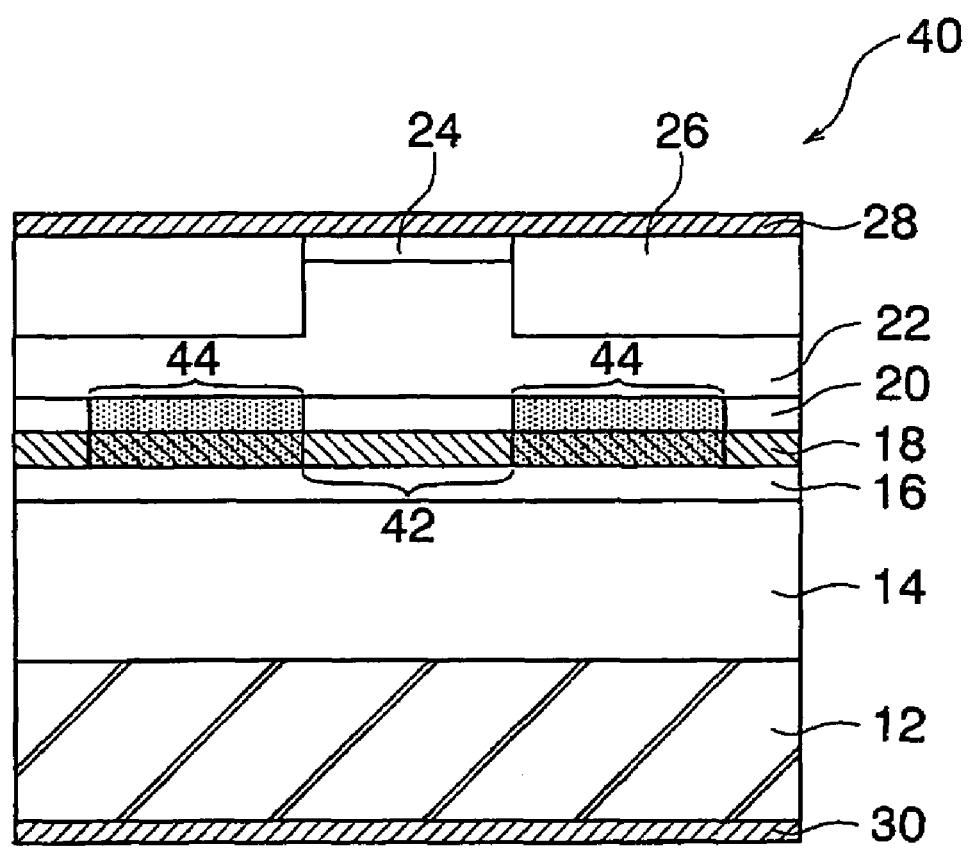
FIG. 1 is a sectional view showing a configuration of a semiconductor laser device of a first embodiment.
Figure 5:
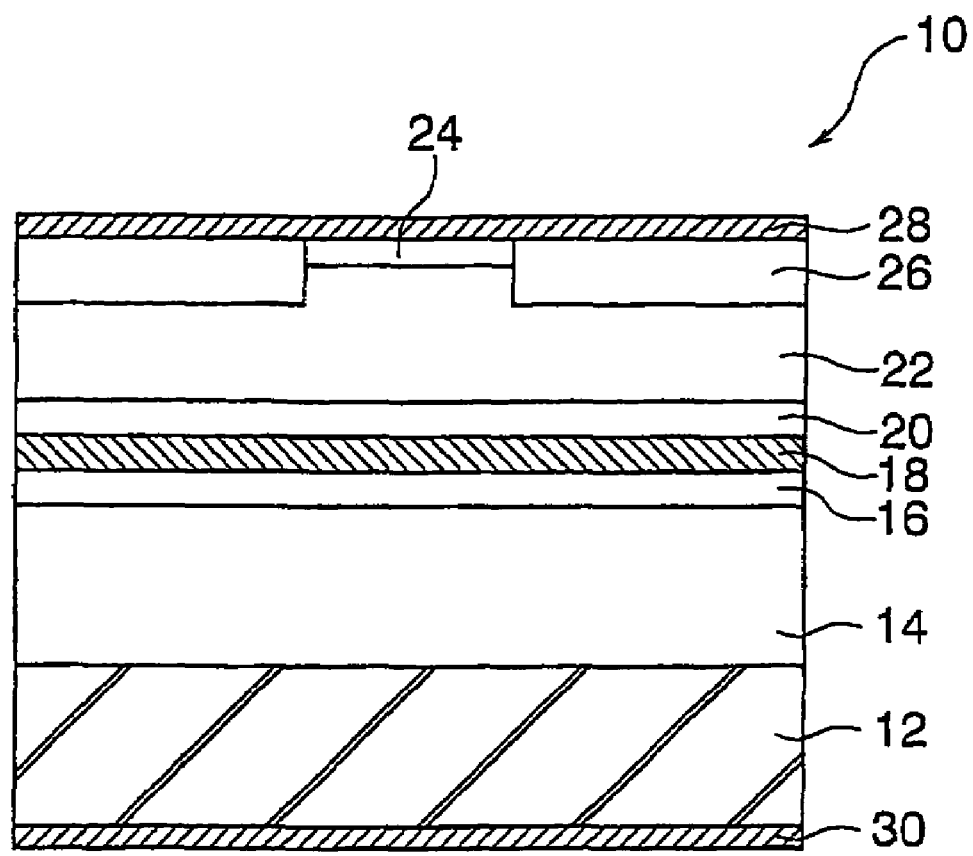
FIG. 5 is a sectional view showing a configuration of a conventional broad-area type semiconductor laser device.

This embodiment is one example of the semiconductor laser device according to the present invention. FIG. 1 is a sectional view showing the configuration of the semiconductor laser device of this embodiment. In the members shown in FIG. 1, the same symbols are given to the same members as those in FIG. 5. A semiconductor laser device 40 in this embodiment is the broad-area type semiconductor laser device whose oscillation wavelength is 780 nm. As shown in FIG. 1, this has the same configuration and the same layer structure as the conventional broad-area type semiconductor laser device 10, except that the two-dimensional photonic crystallization is performed on regions 44 on both sides of a light emission area 42 of an AlGaAs active layer 18 and a p-AlGaAs guide layer 20. Here, the light emission area 42 is the region immediately under a striped p-GaAs cap layer 24 surrounded by an n-GaAs current block layer 26.

Figure 2A:
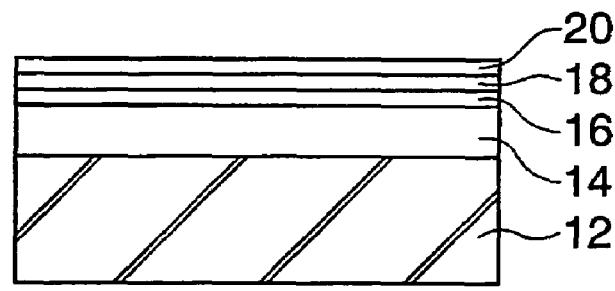
FIGS. 2A, 2B are sectional views at main steps when the above-mentioned semiconductor laser device 40 is manufactured in accordance with a method in the first embodiment.
Figure 2B:
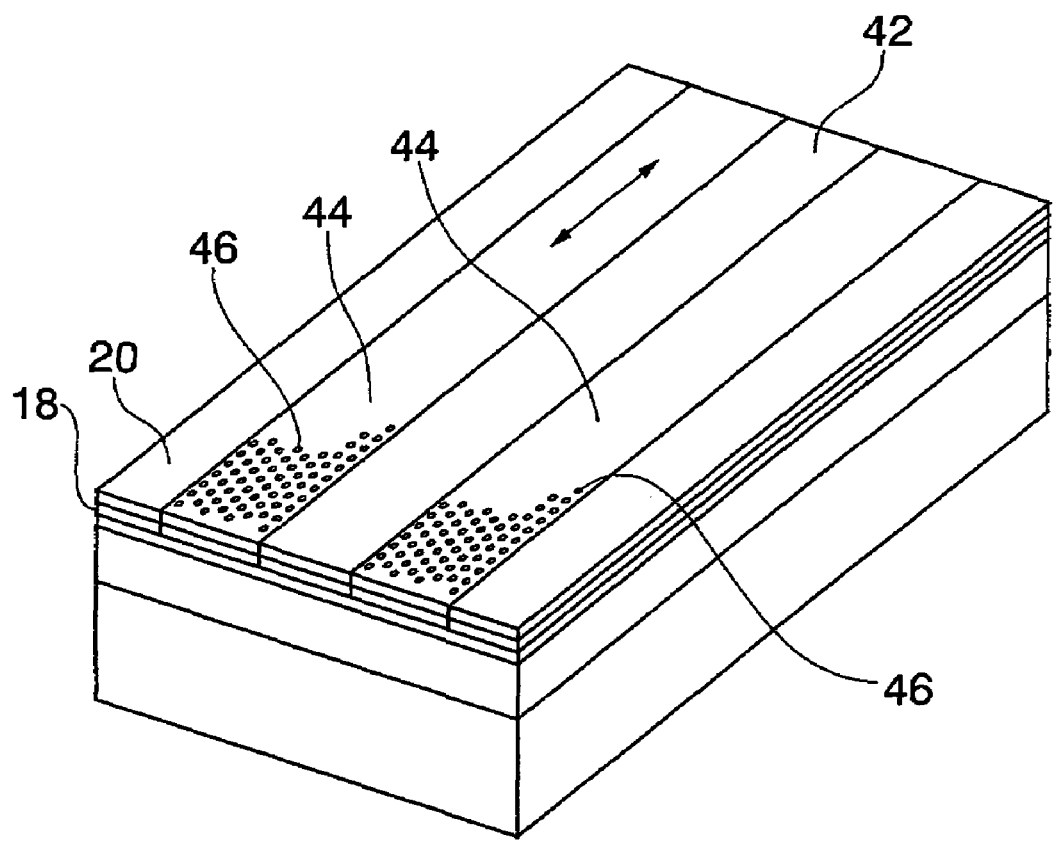

The structure of the two-dimensional photonic crystal formed in the regions 44 on both sides of the light emission area 42 is the structure in which innumerable micro pores extended in the direction vertical to the substrate surface of an n$^+$-GaAs substrate 12 are arranged in the regions 44 on both sides of the light emission area 42 in a periodic array, as shown in FIG. 2B, and this is the crystal structure having the property that the laser light of 780 nm can not be wave-guided in a direction (a direction of a resonator length, namely, a direction represented by an arrow in FIG. 2B) parallel to a striped ridge within the region 44. Thus, the light of 780 nm traveling in the resonator direction can exist only in the light emission area 42 surrounded by the two photonic crystal regions 44. Hence, it becomes at the situation of a lateral optical confinement caused by the photonic crystal region 44.

In the semiconductor laser device 40 in this embodiment, as mentioned above, the two-dimensional photonic crystallization is carried out to thereby generate the region 44 where the light wave-guided in the resonator length direction cannot exist, and the region 44 is used to carry out the optical confinement. Thus, the loss of the light is suppressed at both edges of the stripe serving as the boundary of the optical confinement, namely, the boundary between the region 42 and the region 44. The curve of a wave-guide surface is reduced. Hence, the light intensity distributions of the NFP and the FFP become uniform.

First Embodiment of Method of Manufacturing Semiconductor Laser Device

This embodiment is one example in which the manufacturing method of the semiconductor laser device according to the first invention method is applied to the above-mentioned manufacturing of the semiconductor laser device 40. FIGS. 2A, 2B are sectional views of the above-mentioned semiconductor laser device 40 at the main process steps when it is manufactured in accordance with the method in this embodiment. In the members shown in FIGS. 2A, 2B, the same symbols are given to the same members as those in FIG. 5. In accordance with the method of this embodiment, when the above-mentioned semiconductor laser device 40 is manufactured, at first, the n-Al$_{0.7}$Ga$_{0.3}$As clad layer 14, the n-Al$_{0.3}$Ga$_{0.7}$As guide layer 16, the Al$_{0.1}$Ga$_{0.9}$As active layer 18 and the p-Al$_{0.3}$Ga$_{0.7}$As guide layer 20 are epitaxially grown sequentially on the n$^+$-GaAs substrate 12 by using the metal organic chemical vapor deposition method (MOCVD method) and the like, as shown in FIG. 2A, similarly to the conventional method, whereby the multilayer structure is formed.

After the formation of the multilayer structure, a wafer is taken out of a crystal growing apparatus. Subsequently, a mask (not shown) that has the pattern in which micro pores are arrayed at a periodic array on the region 44 where the photonic crystallization is performed, namely, the stripe-shaped region 44 on both sides of the light emission area 42 and perfectly covers the regions except the regions 44 including the light emission area 42 is formed on the p-AlGaAs guide layer 20. For example, photo-resist, SiO$_2$ and the like are used for the mask material. Next, a proper etching method, such as an RIE (Reactive Ion Etching) method and the like, is used to etch the AlGaAs active layer 18 and the p-AlGaAs guide layer 20. When the mask is removed after the etching, the micro pores 46 are formed at the same periodic array as the periodic array of the micro pores formed on the mask, on the region 44 in the p-AlGaAs guide layer 20 and in the AlGaAs active layer 18, as shown in FIG. 2B. Consequently, the two-dimensional photonic crystallization is attained. The depth in the photonic crystallization can be adjusted by adjusting the etching condition and thereby controlling the depth of the vacancies 26.

Next, the wafer is again set in the crystal growing apparatus. Then, the p-Al$_{0.7}$Ga$_{0.3}$As clad layer 22 and the p-GaAs cap layer 24 are epitaxially grown to thereby form the multilayer structure. Subsequently, similarly to the conventional method, the ridge is formed and embedded, and the p-side electrode 28 and the n-side electrode 30 are formed.

Second Embodiment of Semiconductor Laser Device

This embodiment is another example of the semiconductor laser device according to the first invention. In the first embodiment, the region 44 is photonic-crystallized and has the structure of the two-dimensional photonic crystal. However, in this embodiment, the region 44 is three-dimensional-photonic-crystallized by a micro processing technique. In the three-dimensional photonic crystal, the proper design of the photonic crystal structure enables the attainment of the condition at which the light having a particular wavelength is never propagated independently of a direction, namely, the light having the particular wavelength can not exist at all. So, the introduction of the three-dimensional photonic crystal structure into the regions 44 enables the regions 44 on both sides of the light emission area 42 to be the region where the laser light cannot exist at all. Thus, in this embodiment, the loss of the light at both edges of the stripe is further suppressed over the first embodiment introducing the two-dimensional photonic crystal, and the curve of a wave-guide surface is reduced thereby to make uniform the light intensity distributions of the NFP and the FFP.

Third Embodiment of the Semiconductor Laser Device

Figure 3:
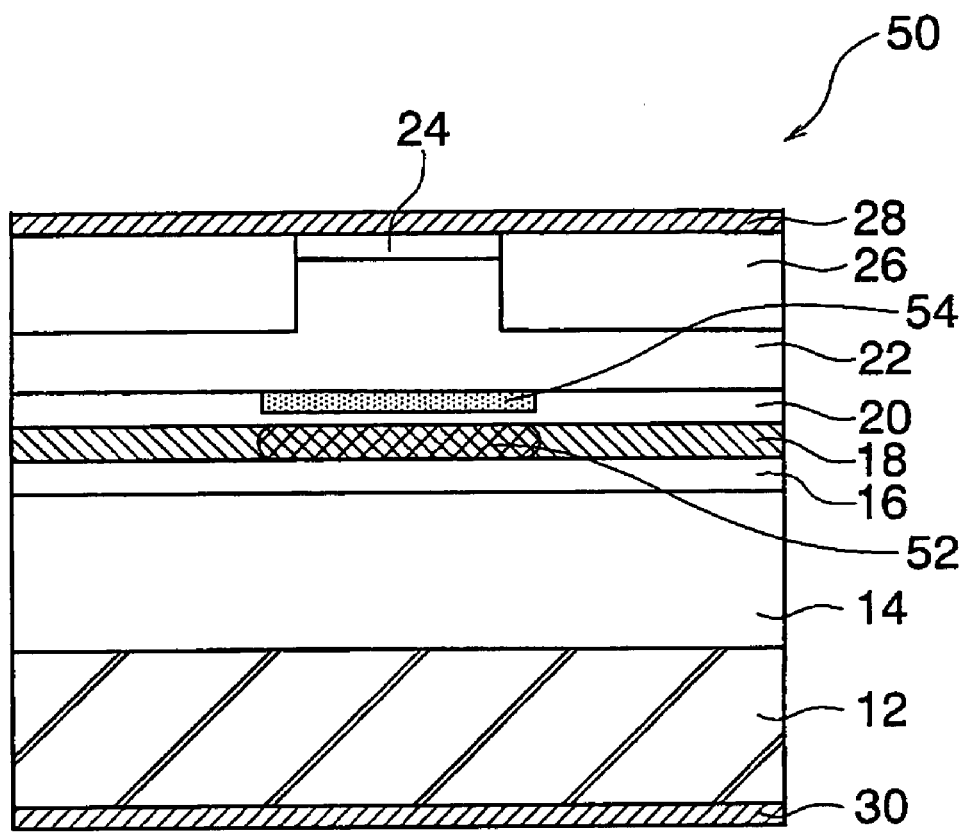
FIG. 3 is a sectional view showing a configuration of a semiconductor laser device of a third embodiment.

This embodiment is one example of the semiconductor laser device according to the second invention. FIG. 3 is a sectional view showing the configuration of the semiconductor laser device of this embodiment. In the members shown in FIG. 3, the same symbols are given to the same members as those in FIG. 5. A semiconductor laser device 50 in this embodiment is a broad-area type semiconductor laser device whose oscillation wavelength is 780 nm. As shown in FIG. 3, this has the same configuration and the same layer structure as the conventional broad-area type semiconductor laser device 10, except that the a region 54 of the p-AlGaAs guide layer 20 on a light emission area 52 is two-dimensional-photonic-crystallized.

Figure 4A:
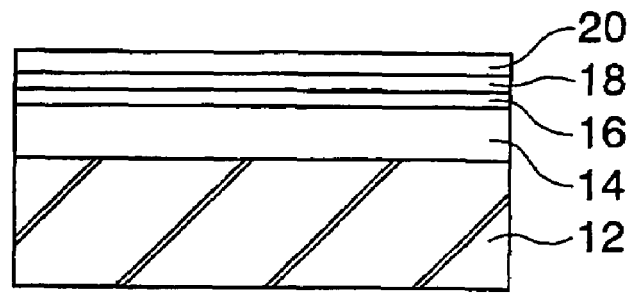
FIGS. 4A, 4B are sectional views of the above-mentioned semiconductor laser device 40 at main process steps when it is manufactured in accordance with a method in a second embodiment.
Figure 4B:
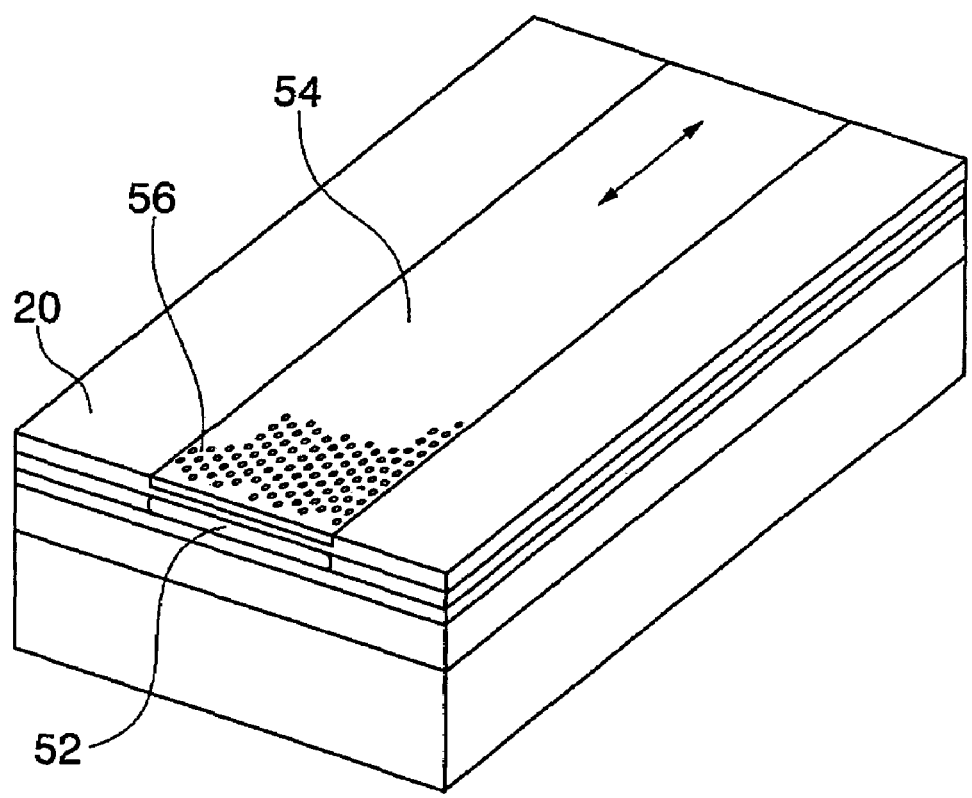

The structure of the two-dimensional photonic crystal formed on the region 54 of the p-AlGaAs guide layer 20 is the structure in which the innumerable micro pores extended in the direction vertical to the substrate surface of the n$^+$-GaAs substrate 12 are arranged in the regions 54 on the light emission area 52 in a periodic array, as shown in FIG. 4B, and this is the crystal structure having the property that the laser light of 780 nm promotes the wave guidance in a direction (a direction of a resonator length, namely, a direction represented by an arrow in FIG. 4B) parallel to the striped ridge. In other words, the structure of the two-dimensional photonic crystal shown in FIG. 2B is the structure to promote the light, in which the oscillation wavelength of the laser is, for example, 780 nm, to be wave-guided in the arrow direction (the direction of the resonator) in FIG. 4B. Thus, it is difficult that the light in the direction different from the arrow direction is wave-guided.

Consequently, the light of 780 nm traveling in the resonator direction is affected by the photonic crystallized region 44 and stably wave-guided in the resonator length direction (the arrow direction in FIG. 4B). Also, the vacancies constituting the photonic crystal structure are uniformly formed throughout the region 54 at the equal interval. Thus, the influence of the wave-guidance also promoted by the region 54 has the uniform influence on the entire area within the stripe (the light emission area). Hence, the light is wave-guided at the uniform intensity within the stripe. In this way, the region where the wave-guidance in the particular direction of the light having the particular wavelength is promoted is used to carry out the optical confinement, which can attain the stabilization and the uniformity of the intensities of the wave-guided lights and can also uniform the light intensity distributions of the NFP and the FFP.

Second Embodiment of Method of Manufacturing Semiconductor Laser Device

This embodiment is one example in which the manufacturing method of the semiconductor laser device according to the second invention method is applied to the above-mentioned manufacturing of the semiconductor laser device 50. FIGS. 4A, 4B are respective sectional views of the above-mentioned semiconductor laser device 50 at the main process steps when it is manufactured in accordance with the method in this embodiment. In the members shown in FIGS. 4A, 4B, the same symbols are given to the same members as those in FIG. 5. In accordance with the method of this embodiment, when the above-mentioned semiconductor laser device 50 is manufactured, at first, the n-Al$_{0.7}$Ga$_{0.3}$As clad layer 14, the n-Al$_{0.3}$Ga$_{0.7}$As guide layer 16, the Al$_{0.1}$Ga$_{0.9}$As active layer 18 and the p-Al$_{0.3}$Ga$_{0.7}$As guide layer 20 are epitaxially grown sequentially on the n$^+$-GaAs substrate 12 by using the metal organic chemical vapor deposition method (MOCVD method) and the like, similarly to the conventional method, whereby the multilayer structure is formed.

After the formation of the multilayer structure, the wafer is taken out of the crystal growing apparatus. Subsequently, on the region 54 where the photonic crystallization is performed, namely, the region 54 on the light emission area 52 of the p-AlGaAs guide layer 20, a mask (not shown) that has the pattern in which the micro pores are arrayed at the periodic array and perfectly covers the regions except the region 54 is formed on the p-AlGaAs guide layer 20. For example, the photo-resist, the $SiO_2$ and the like are used for the mask material. Next, the proper etching method, such as the RIE (Reactive Ion Etching) method and the like, is used to etch the p-AlGaAs guide layer 20. When the mask is removed after the etching, the micro pores 56 are formed at the same periodic array as the periodic array of the micro pores formed on the mask, on the region 54 of the p-AlGaAs guide layer 20, as shown in FIG. 4B. Consequently, the two-dimensional photonic crystallization is attained. The depth in the photonic crystallization can be adjusted by adjusting the etching condition and thereby controlling the depth of the vacancies 56.

Next, the wafer is again set in the crystal growing apparatus. Then, the $p-Al_{0.7}Ga_{0.3}As$ clad layer 22 and the p-GaAs cap layer 24 are epitaxially grown to thereby form the multilayer structure. Subsequently, similarly to the conventional method, a ridge is formed and embedded, and the p-side electrode 28 and the n-side electrode 30 are formed.

In this embodiment, the region 54 on the light emission area 52 is photonic-crystallized. A width of the region 54 on which the photonic crystallization is performed does not need to be perfectly coincident with a width of the light emission area 52. It may be the region 54 having a width slightly larger than that of the light emission area 52. Also, in this embodiment, it is necessary to define a thickness in such a way that a thickness of the layer on which the photonic crystallization is performed is a thickness in a range in which the active layer 18 is not damaged and that the light wave-guided through the active layer 18 receives the influence of the photonic crystallization region.

Fourth Embodiment of Semiconductor Laser Device

This embodiment is still another example of the semiconductor laser device according to the second invention. In the third embodiment, the region 54 of the p-AlGaAs guide layer 20 is photonic-crystallized so that it has the structure of the two-dimensional photonic crystal. However, in this embodiment, although not shown, the region below the light emission area 52 of the n-AlGaAs guide layer 16 and the region of the n-AlGaAs clad layer 14 under it are two-dimensional-photonic-crystallized. Thus, it is possible to provide the same effect as the third embodiment. When the semiconductor laser device in this embodiment is manufactured, after the formation of the n-AlGaAs guide layer 16, the predetermined region is photonic-crystallized similarly to the manufacturing method of the semiconductor laser device in the second embodiment. Subsequently, similarly to the conventional method, the layers on and after the AlGaAs active layer 18 is epitaxially grown to thereby form the multilayer structure. Then, the ridge is formed, and the semiconductor laser device is manufactured.

In the first to fourth embodiments of the semiconductor laser device and the first and second embodiments of the manufacturing method of the semiconductor laser device, they have been explained by exemplifying the AlGaAs-based semiconductor laser device. However, the present invention is not limited to the AlGaAs-based semiconductor laser device. Naturally, it can be applied to even a semiconductor laser device of a GaN-based, an InP-based and the like.

Finally, the embodiments and examples described above are only examples of the present invention. It should be noted that the present invention is not restricted only to such embodiments and examples, and various modifications, combinations and sub-combinations in accordance with its design or the like may be made without departing from the scope of the present invention.

What is claimed is:

1. A semiconductor laser device comprising
   a multilayer structure including at least an active layer, a guide layer and a clad layer,
   wherein the guide layer is disposed adjacent to the active layer and between the active layer and the clad layer,
   wherein laser light is emitted from the semiconductor laser device in a resonator length direction,
   wherein a region at least directly over a light emission area of said guide layer formed on said active layer or a region at least directly beneath said light emission area of said guide layer formed under said active layer is a multi-dimensional-photonic-crystallized region, and
   wherein said multi-dimensional-photonic-crystallized region of said guide layer is formed in such a way that propagation in the resonator length direction of a laser light is promoted within the region.

2. A semiconductor laser device comprising
   a multilayer structure including at least an active layer, a guide layer and a clad layer,
   wherein the guide layer is disposed adjacent to the active layer and between the active layer and the clad layer,
   wherein laser light is emitted from the semiconductor laser device in a resonator length direction,
   wherein a region at least directly beneath a light emission area of said guide layer formed under said active layer and a semiconductor layer formed under said guide layer is a multi-dimensional-photonic-crystallized region, and
   wherein said multi-dimensional-photonic-crystallized region of said guide layer is formed in such a way that propagation in the resonator length direction of a laser light is promoted within the region.

3. The semiconductor laser device according to claims 1 or 2, wherein a width of the light emission area, extending in a stripe shape on a surface parallel to a P-N junction plane of said multilayer structure, is 10 µm or more.

4. The semiconductor laser device according to claims 1 or 2, wherein a width of the light emission area, extending in a stripe shape on a surface parallel to a P-N junction plane of said multilayer structure, is 10 µm or more, and
   a direction in which the light is emitted is not vertical to said P-N junction plane.

5. The semiconductor laser device according to claims 1 or 2, wherein in said multi-dimensional-photonic-crystallized region, micro pores, extending in a direction vertical to a P-N junction plane of said multilayer structure, are arranged in a periodic array.

6. The method of making and/or using a laser utilizing the semiconductor laser device of claim 1.

7. The method of making and/or using a laser utilizing the semiconductor laser device of claim 2.

* * * * *